US007724079B1

(12) United States Patent
Shumarayev

(10) Patent No.: US 7,724,079 B1
(45) Date of Patent: *May 25, 2010

(54) PROGRAMMABLE LOGIC ENABLED DYNAMIC OFFSET CANCELLATION

(75) Inventor: Sergey Yuryevich Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 11/954,925

(22) Filed: Dec. 12, 2007

Related U.S. Application Data

(63) Continuation of application No. 11/245,581, filed on Oct. 6, 2005, now Pat. No. 7,321,259.

(51) Int. Cl.
*H03F 1/02* (2006.01)
*H04B 1/04* (2006.01)

(52) U.S. Cl. .......................... 330/9; 330/253; 330/258; 327/307; 327/317; 455/299; 455/127

(58) Field of Classification Search ................ 330/258, 330/253, 2, 9; 327/307, 309
See application file for complete search history.

(56) References Cited

U.S. PATENT DOCUMENTS

| 4,833,418 | A | | 5/1989 | Quintus et al. |
| 5,410,270 | A | | 4/1995 | Rybicki et al. |
| 5,467,045 | A | * | 11/1995 | Tanigawa ..................... 327/336 |
| 5,631,603 | A | | 5/1997 | Stubbe et al. |
| 5,793,230 | A | | 8/1998 | Chu et al. |
| 5,982,196 | A | | 11/1999 | Sever |
| 6,552,593 | B2 | | 4/2003 | Blon et al. |
| 6,621,360 | B1 | * | 9/2003 | Xu et al. ........................ 331/57 |
| 6,737,913 | B2 | * | 5/2004 | Goldenberg ..................... 330/2 |
| 6,750,719 | B2 | * | 6/2004 | Toyota et al. ................ 330/285 |
| 7,016,613 | B2 | * | 3/2006 | Savoj ........................... 398/155 |
| 7,057,460 | B2 | * | 6/2006 | Kaviani et al. ............... 330/261 |
| 7,268,624 | B2 | * | 9/2007 | Chen et al. ................... 330/258 |
| 7,319,220 | B2 | * | 1/2008 | Soltesz et al. ............ 250/214 A |
| 7,368,968 | B1 | * | 5/2008 | Lai et al. ..................... 327/307 |
| 7,541,857 | B1 | * | 6/2009 | Wong et al. .................. 327/317 |
| 2003/0148749 | A1 | | 8/2003 | Saito |
| 2003/0151443 | A1 | | 8/2003 | Kondo et al. |

* cited by examiner

*Primary Examiner*—Vibol Tan
(74) *Attorney, Agent, or Firm*—Townsend and Townsend and Crew LLP

(57) ABSTRACT

Techniques and circuitry are provided for programmatically controlling signal offsets in integrated circuitry. In one embodiment, a buffer circuit having an offset cancellation circuit receives a signal and transmits the signal to programmable logic circuit. The programmable logic uses programmable resources and/or one or more algorithms to measure integrated circuit operations and/or operational errors associated with the offset. The control signal is fed back to an input of the offset cancellation circuit. In one embodiment, the offset cancellation circuit adjusts the offset of the signal in response to the magnitude of the offset cancellation signal received until changes associated with the offset and/or the magnitude of the operational errors are no longer attributable to the offset.

18 Claims, 6 Drawing Sheets

US 7,724,079 B1

PROGRAMMABLE LOGIC ENABLED DYNAMIC OFFSET CANCELLATION

CLAIM FOR PRIORITY

This non-provisional application is a continuation of and claims the benefit of U.S. patent application Ser. No. 11/245,581, filed Oct. 6, 2005, which is incorporated by reference in its entirety for all purposes.

BACKGROUND OF THE INVENTION

The present invention relates to techniques for controlling signal offsets, and more particularly, to techniques for dynamically correcting offsets associated with integrated circuit buffers and amplifiers using programmable resources.

Generally, interface circuitry such as input and output buffer circuits are used to amplify and/or condition signals for detection or transmission. In the case of an input buffer in a telecommunication system, the circuit receives an input signal that has typically undergone degradation and attenuation as it propagated through a transmission link. The function of the input buffer is therefore to amplify and recondition the received signal, and in some cases to provide frequency equalization, so that the receiver circuitry can properly resolve the incoming bits. In the case of an output buffer, the circuit is typically required to drive an output signal at the appropriate levels for a given transmission link. In either case, any signal offset that may be caused by the buffer circuitry can contribute to operational error. For example, any offset in the first stage of a typical multi-stage limiting amplifier in the analog front-end of a receiver is amplified by subsequent stages. The amplified offset reduces the available timing margins needed to resolve incoming data bits. This causes an increase in the bit error rate (BER) of the receiver circuit. The amount of overall voltage offset grows proportionally to square root of sum of squares of individual stage offsets, where summation is done for all stages, hence the number of cascaded buffer circuits in the signal path and the greater the amount of offset, the greater the potential increase in BER. This is further exacerbated as integrated circuits shrink in size and operate at reduced voltage margins. In the case of output buffers, offsets cause undesirable duty cycle distortion for the output signal. Various offset cancellation techniques have therefore been developed to eliminate or reduce the adverse effects of offset signals.

Generally, offset cancellation schemes either provide for a one-time correction of signal offset usually upon power-up or initial configuration, or use an internal feedback loop to continuously monitor and correct for offset. Conventional one-time offset calibration techniques require addition circuitry to enable/disable offset cancellation and are only accurate at the time the device is calibrated. Furthermore, circuits using one-time offset calibration are typically affected by environmental variations such as changes in temperature after calibration which reduces their efficacy. Conventional dynamic offset cancellation circuits with an internal feedback loop typically assume that input signals are DC-balanced, and require additional front-end circuitry specific to a particular analog or digital system to complete the feedback loop. They therefore tend to require more complex circuitry which also adds to loading conditions.

There is therefore a need for circuits and methods to reduce or eliminate signal offsets in order to improve integrated circuit operational performance.

BRIEF SUMMARY OF THE INVENTION

Embodiments of the present invention pertain to techniques and circuitry to control signal offsets in integrated circuits and systems. Generally, the present invention employs programmable resources to dynamically monitor and correct for offsets without increasing circuit complexity and loading conditions. The programmability of the offset cancellation technique according to the present invention allows for creating the optimum algorithm for a given application, to evaluate system performance and to cancel offset when necessary.

In one embodiment, the present invention provides an integrated circuit having a buffer with an offset cancellation circuit. The buffer is coupled to programmable logic wherein the programmable logic is configured to monitor any offset in the buffer and to generate an offset control signal in response thereto. The offset control signal generated by the programmable logic is fed back to the offset cancellation circuit of the buffer to adjust the offset level of the buffer.

In another embodiment, the present invention provides a method of correcting signal offsets for signals processed by an integrated circuit. The method includes programmably monitoring operational error associated with the signal offsets, generating an offset control signal in response to the integrated circuit operational error, and applying the offset control signal to an offset correction circuit configured to adjust offset levels.

A better understanding of the nature and advantages of the present invention can be gained from the following detailed description and the accompanying drawings.

DETAILED DESCRIPTION OF THE INVENTION

The present invention pertains to detecting and correcting for signal offsets using programmable resources. Generally, signal offsets may be categorized as DC voltage offsets or as average voltage offsets attributable to AC waveforms. For example, when integrated circuits are DC coupled, signal offsets may be described in terms of a DC voltage offset. When the integrated circuits are AC coupled, the signal offsets may be categorized as a voltage offset due to an averaging of the AC waveform transmitted therebetween. For example, in the case of an AC coupled differential amplifier, the AC offset averages converge to an average common-mode offset voltage. Signal offsets are caused by variations and mismatches in transistors and other integrated circuit components. For example, a buffer circuit may include a differential amplifier with a differential input pair of transistors. Any mismatches in physical and electrical characteristics of the transistors forming the differential input pair can cause significant offset. The present invention provides various techniques for correcting these types of offsets. While the invention is described herein in the context of various differential input buffers, those skilled in the art will appreciate that the techniques described herein can be applied to single-ended circuits as well as output buffers and any other circuitry that can benefit from offset cancellation.

Figure 1:
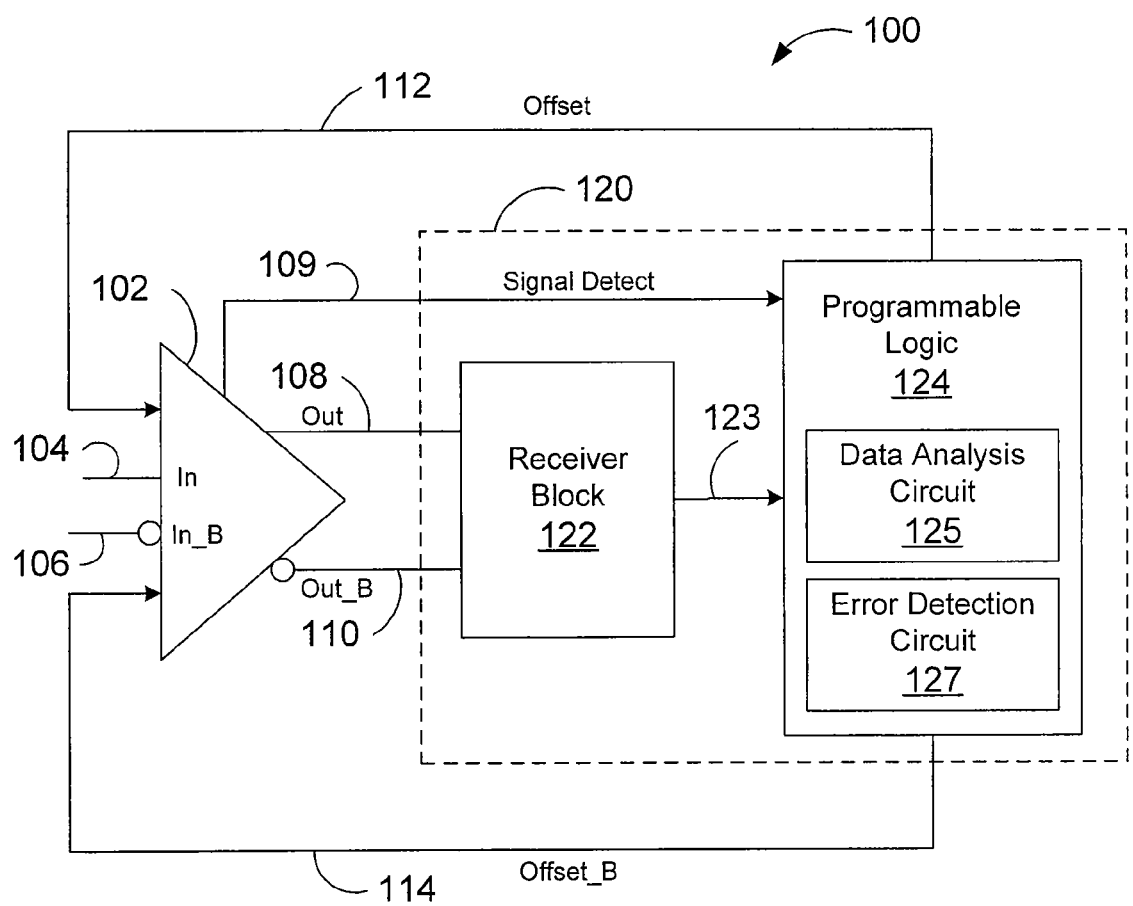
FIG. 1 is a high-level block diagram of one exemplary embodiment of dynamic offset cancellation circuit according to the present invention.

Referring to FIG. 1, there is shown a high level block diagram of an integrated circuit 100 with programmably enabled offset cancellation according to one exemplary embodiment of the present invention. Circuit 100 includes a differential input buffer 102 that receives a differential input signal at input 104 and input 106. Input buffer 102 amplifies the input signal and couples it to a signal processing circuit 120 via outputs 108 and 110. Signal processing circuit 120 includes programmable resources such as programmable logic 124 coupled to other circuitry such as a receiver block 122. Receiver block 122 receives the differential output of buffer 102 and processes the data bits. Programmable logic 124 may be configured, in one embodiment, to include a data analysis circuit 125 and/or error detection circuit 127 that analyzes the data received from receiver block 122 on line 123. Based on the result of the data analysis and error detection, programmable logic 124 generates control signal Offset 112 and control signal Offset_B 114 that are fed back to input buffer 102. The control signals 112 and 114 adjust the offset in buffer 102 to compensate for the signal offset and to improve the operational error rates of circuit 100. The feedback loop according to this embodiment of the present invention thus allows the circuit 100 to dynamically correct for signal offsets.

The provision of programmable logic 124 simplifies the front-end circuitry for offset cancellation and allows the user to develop an offset cancellation algorithm that evaluates system performance and cancels offsets based on the needs of a given application. Programmable logic 124 can be configured to monitor the offset of the signal at the output of receiver block 123 using a variety of methods. One method, for example, first applies logic one to both inputs 104 and 106 of buffer 102 and then switches both to logic zero and detects the switching point at which signal transition occurs at the output 123 of receiver block 122. The offset voltage of the input buffer 102 can thus be measured by this calibration process. Programmable logic 124 allows the user to perform this calibration process under system control whenever there is no data traffic, as needed. A similar process can be performed if input data is AC coupled. For AC coupled inputs, when there is no toggling of the signal, the DC level converges to the common mode level allowing the system to measure the offset by detecting the switching point for signal transition at the output of the receiver.

According to yet another method, programmable logic 124 monitors the error rate of the receiver and modifies the offset control signals. If, for example, the error rate is too high, the offset control signals can be incremented and the error rate monitored. Depending on the error response to the increment in the magnitude of the offset control signals, the system will correct the direction of the offset adjustment. That is, an increase in offset control signal results in an increase in error rates, the system will respond by decreasing the magnitude of the offset control signal. This method can be employed on-the-fly while the circuit receives and processes data.

Error rate detection can be implemented by software in the programmable logic 124. Buffer 102 may include a signal detect or loss-of-signal (LOS) circuit that generates an LOS signal that can be used by programmable logic 124 in its offset calibration process. A system may choose to combine two or more of these offset monitoring methods. For example, offset calibration based on direct measurement of the offset when there is no data traffic can be performed in addition to on-the-fly offset tuning based on error rate detection. Also, programmable logic 124 can be programmed to maintain a statistical record of error rate to adjust for environmental changes over time.

Figure 2:
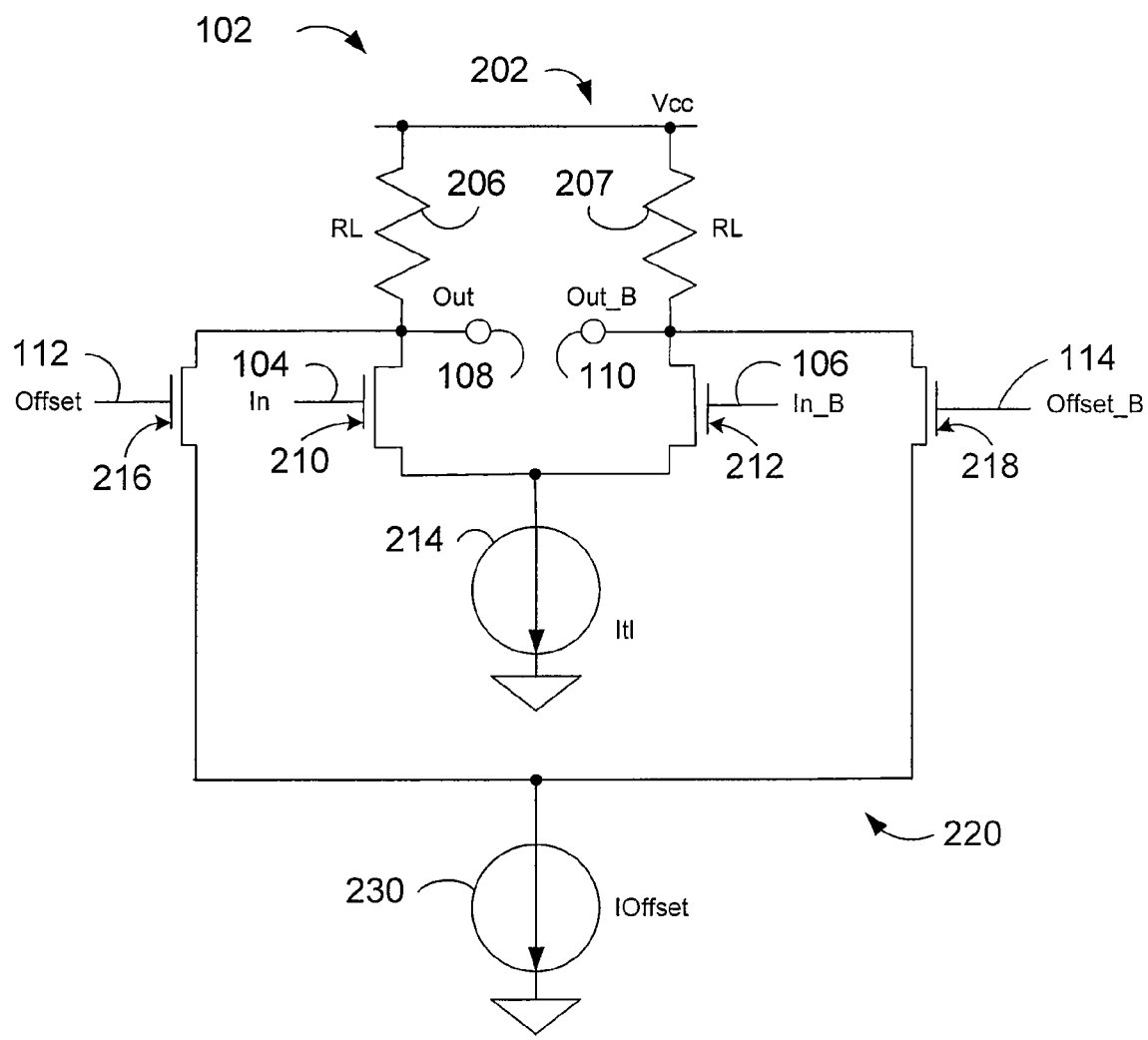
FIG. 2 is a simplified circuit diagram for a buffer with offset cancellation circuitry according to an exemplary embodiment of the present invention.

Referring to FIG. 2, there is shown a simplified circuit implementation for an input buffer 200 with offset cancellation circuitry according to an exemplary embodiment of the present invention. The buffer 200 includes a class A differential pair 202 made up of a pair of input transistors 210 and 212 whose gate terminals couple to inputs 104 and 106, respectively. Load resistors 206 and 207 respectively couple to drain terminals of input transistors 210 and 212, and tail current source 214 couples to a common-source node of input transistors 210 and 212. Tail current source 214, in this example, would typically be implemented by an n-channel transistor whose gate connects to a bias voltage. When offset is present in such a differential pair, for zero input differential voltage applied to input pints 104 and 106, there will be a non-zero output voltage either in the negative direction or the positive direction. To correct for this offset, a de-skewing circuit 220 is added in parallel to the differential pair. De-skewing circuit 220 includes a pair of transistors 216 and 218 that connect in parallel to input transistors 210 and 218, respectively, with a tail current source 230 as shown. The gate terminals of transistors 216 and 218 receive the offset control signals Offset and Offset_B, respectively. The offset control signals (generated by programmable logic 214 in FIG. 1) compensate for any offset by biasing de-skewing transistors 216 and 218 in the direction opposite the inherent offset of the differential pair 202.

Figure 3:
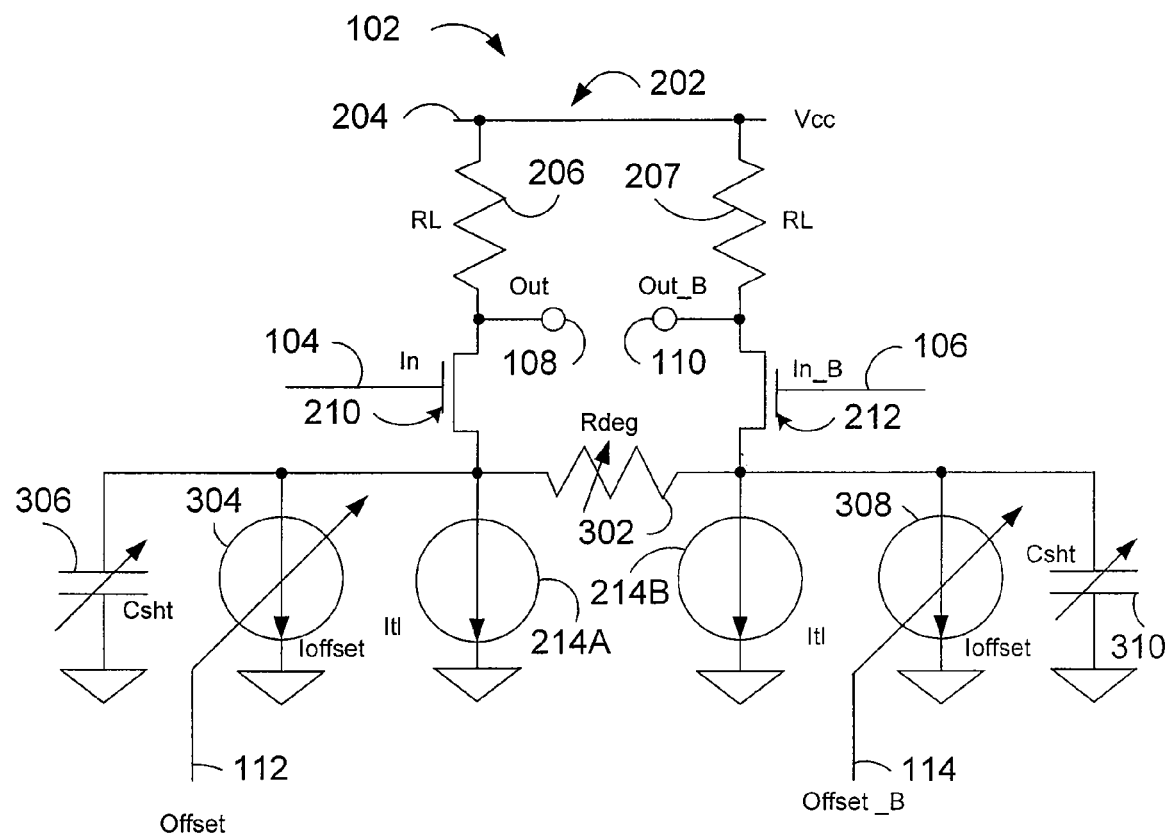
FIG. 3 is a simplified circuit diagram for a buffer with n-channel input transistors and programmable offset cancellation circuitry according to another exemplary embodiment of the present invention.

Other de-skewing circuitry can be used depending on the buffer circuit topology. For example, FIG. 3 shows a simplified circuit diagram for a source degenerated input buffer 300 with programmable offset cancellation circuitry. In this embodiment, a degeneration resistor Rdeg 302 splits the tail current for each leg of the differential pair into two current sources 214A and 214B as shown. Shunt capacitors 306 and 310 are coupled in parallel with tail current sources 214A and 214B, respectively. The degeneration resistor 302 can be made programmable and sets the DC gain and increases linearity, while the shunt capacitors 306 and 310 that can also be made programmable, adjust the AC gain of the buffer circuit. The combination of programmable degeneration resistor 302 and programmable shunt capacitors 306 and 310 add a zero in the frequency response of the buffer amplifier to equalize for link attenuation. The de-skewing or offset cancellation circuit in this embodiment includes programmable tail current source devices 304 and 308 that couple in parallel with rail current sources 214A and 214B, respectively. All current source devices in this example are typically implemented by n-channel transistors with their gate terminals connected to a bias voltage in the case of 214A and 214B, and to offset control signals Offset and Offset_B in the case of 304 and 308, respectively. Offset tail current source devices compensate for any offset in the differential pair by skewing the current balance in a direction opposite to the offset.

Figure 4:
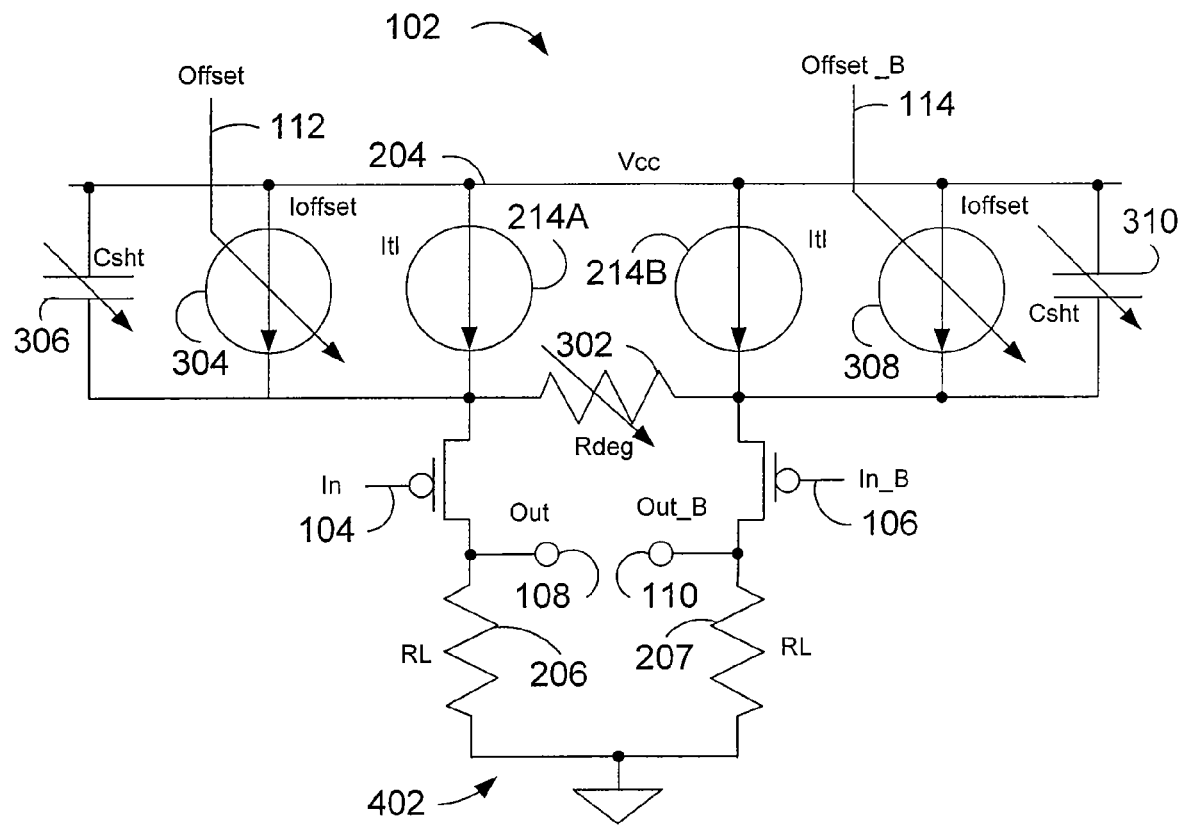
FIG. 4 is a simplified circuit diagram for a buffer with p-channel input transistors and programmable offset cancellation circuitry according to yet another exemplary embodiment of the present invention.

Those skilled in the art appreciate that different types of amplifier circuits based on different circuit topologies can implement de-skewing circuits that are controlled by programmable logic. For example, an amplifier may include multiple cascaded buffers of the type shown in FIG. 2 wherein all, some or only the first one in the chain includes the offset cancellation circuitry. Other amplifiers may combine both types of buffers shown in FIGS. 2 and 3 with different combinations of offset cancellation circuitry. Also, while buffers 200 and 300 of FIGS. 2 and 3 are implemented using n-channel input transistors, similar techniques can be applied to buffer implemented using p-channel input transistors. FIG. 4 is a simplified example of a buffer 400 with p-channel input differential pair 402, source degeneration resistor and programmable offset cancellation circuitry. The offset cancellation circuitry is similar to and operates similarly to the offset cancellation circuitry described above with respect to the n-channel differential pair 202.

Figure 5:
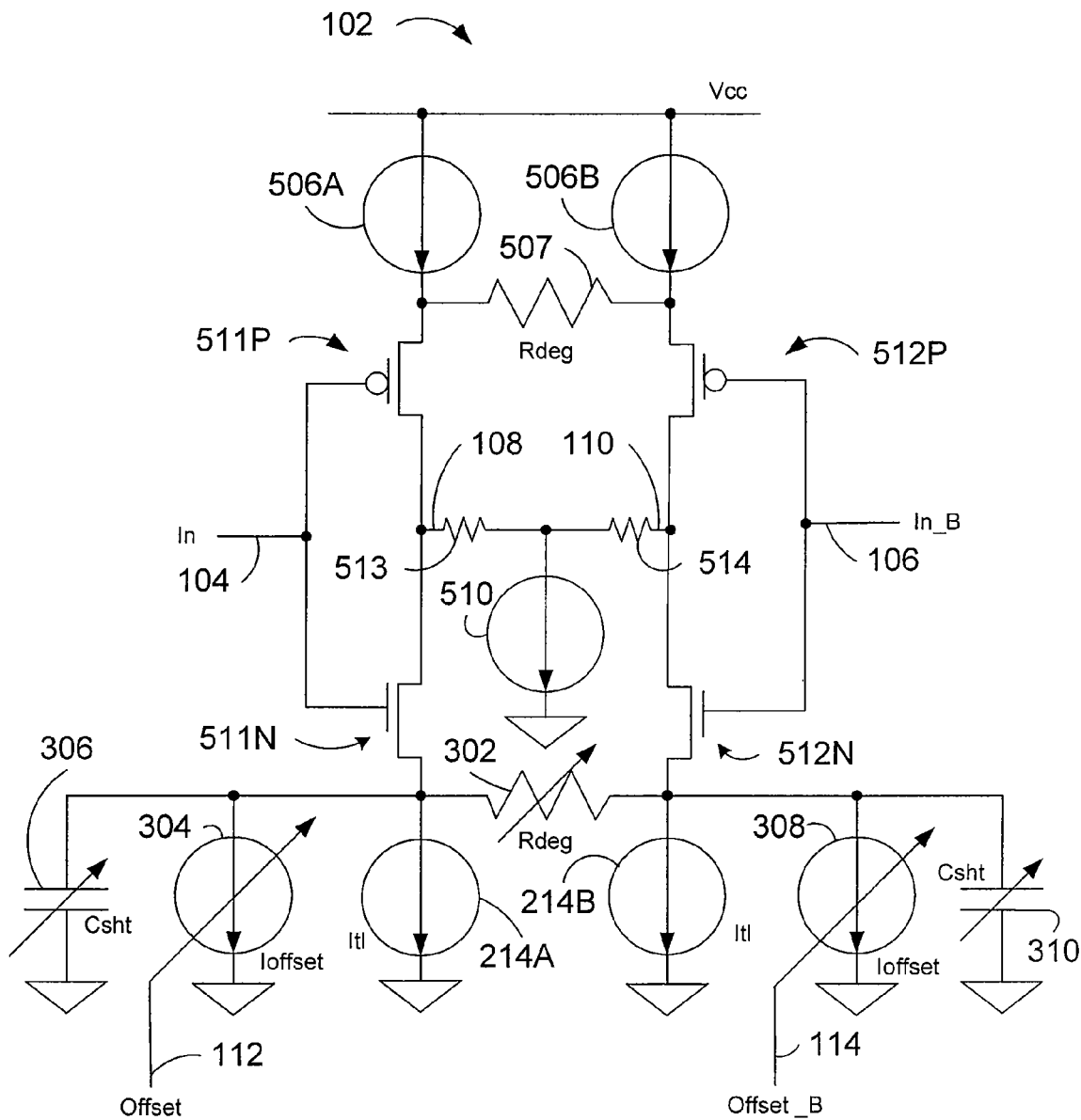
FIG. 5 is a simplified circuit diagram for a class AB buffer with programmable offset cancellation circuitry according to an exemplary embodiment of the present invention.

Other circuit topologies for amplifier buffers that can implement the programmable logic enabled dynamic offset cancellation techniques of the present invention include class B or class AB differential pairs. FIG. 5 is a simplified circuit diagram for a class AB differential amplifier 500. Each leg of differential amplifier 500 includes a complementary pair of p-channel and n-channel transistors 511P/511N and 512P/512N, with the p-channel transistor having current source devices 506A and 506B as well as source degeneration resistor 507. In this example, de-skewing is implemented in the n-channel half of the class AB amplifier with circuitry that is similar to that shown in FIG. 3. Class AB amplifier 500 can implement either an input buffer or an output buffer. Resistors 513 and 514 and current source 510 form the amplifier load circuit. When used as an output buffer, the programmable logic enabled offset cancellation as implemented by programmable offset tail current sources 304 and 308 allow the system to minimize duty cycle distortion in the output signal. Other techniques for addressing duty cycle distortion due to offset signals are described in greater detail in commonly-assigned U.S. patent application Ser. No. 11/193,146, entitled "Circuitry and Methods for Programmable Adjusting The Duty Cycle Of Serial Data Signals," by Shumarayev et al., which is hereby incorporated by reference in its entirety.

While the various programmable logic enabled offset cancellation techniques described herein can be employed in any type of integrated circuit or system, they are particularly well suited for programmable logic devices (PLDs) or field programmable gate arrays (FPGAs). This is so because PLDs and FPGAs provide powerful programmability that can very efficiently implement different aspects of the present invention by any optimized combination of hardware and software. For example, the entire circuit 100 shown in FIG. 1 can be implemented by a complex PLD wherein the receiver block 122 may include any one of a number of typical transceiver circuits such as clock data recovery (CDR), dynamic phase adjustment (DPA), serializer-deserializer, phase locked loop or delay locked loop circuitry and the like including clock networks. Aspects of such transceiver circuits may be found in commonly-assigned U.S. patent application Ser. No. 09/805,843, entitled "Clock Data Recovery Circuitry Associated With Programmable Logic Device Circuitry," by Aung, et al., and U.S. patent application Ser. No. 10/093,785, entitled "Programmable Logic Device With High Speed Serial Interface Circuitry," by Lee et al., which are hereby incorporated by reference in their entirety. These circuit blocks may be implemented by hardwired circuitry while programmable logic 124 is the programmable core of the PLD. Such an implementation allows the user to create an offset cancellation algorithm that may be invoked by the system upon power-up, reset or initialization, during system idle time or when low bit error rate is detected in a given channel. The PLD implementation allows the system or the user to customize the offset cancellation scheme for the needs of the particular application. For example, in telecommunication applications, for channels that run at a lower data rate, the invention allows saving area and power by not enabling offset cancellation altogether. It also makes technology migrations from one generation to the next easier since it eliminates the need to design a complete analog loop based on each technology because offset cancellation is available via the PLD. The invention can be further extended to the entire link wherein not only the offset of the receive can be cancelled but offsets associated with the physical layer and transmitter can be cancelled if both ends of the link are under the control of the PLD user.

Figure 6:
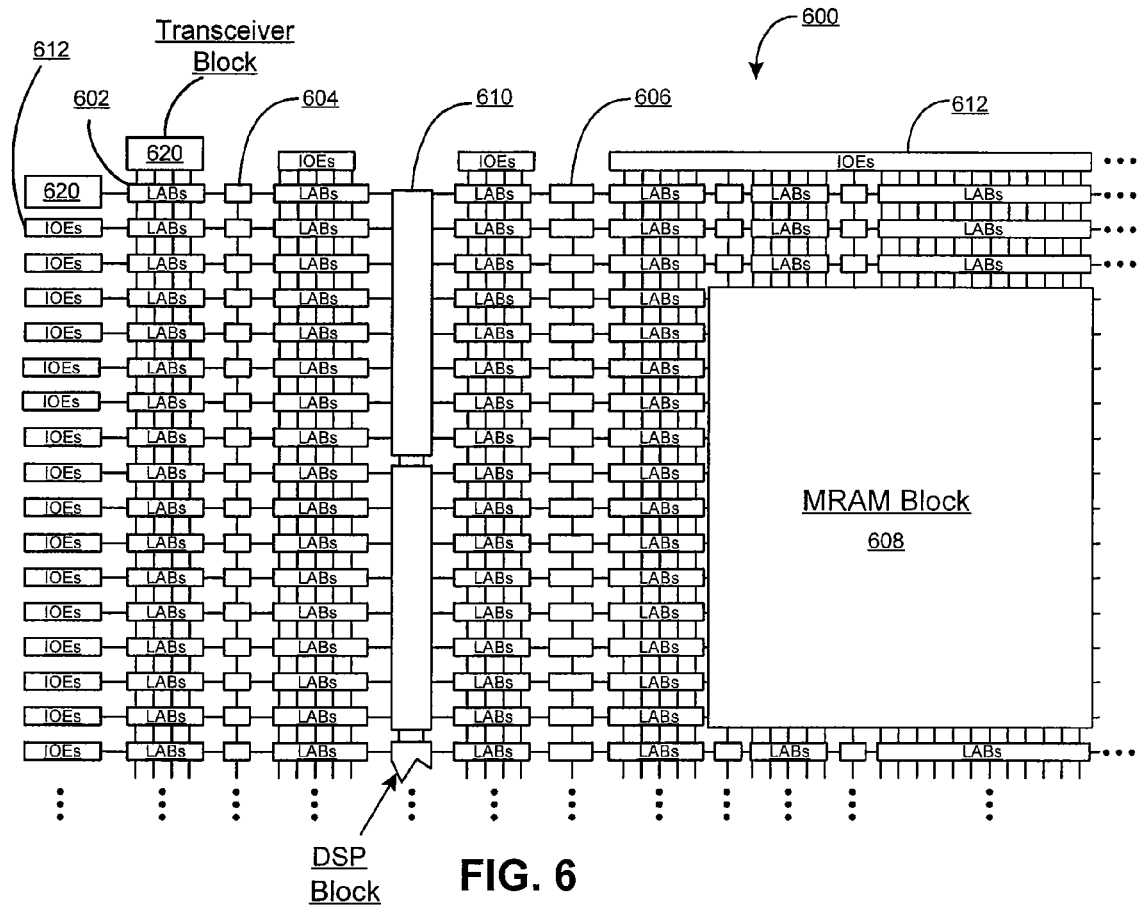
FIG. 6 is a simplified block diagram of a programmable logic device that can embody the techniques of the present invention.

FIG. 6 is a simplified partial block diagram of one example of PLD 600 that can implement aspects of the present invention. It should be understood that the present invention can be applied to numerous types of integrated circuits including programmable logic integrated circuits, field programmable gate arrays, mask FPGAs, and application specific integrated circuits (ASICs) or application specific standard products (ASSPs) that provide programmable resources. Referring to FIG. 6, PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. The RAM blocks include, for example, 512 bit blocks 604, 4K blocks 606, and a block 608 providing 512K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. These I/O elements 612 may include differential input or output buffers with offset cancellation circuitry of the type shown in FIGS. 1-5. PLD 600 can additionally provide transceiver functionality for telecommunication applications. In the exemplary embodiment shown in FIG. 6, PLD 600 includes one or more transceiver blocks 620. Transceiver blocks 620 may include receiver block 122 of FIG. 1 and may implement offset cancellation techniques as described herein. It is to be understood that PLD 600 is described herein for illustrative purposes only and that the present invention can be implemented in many different types of PLDs, FPGAs, and the like.

Figure 7:
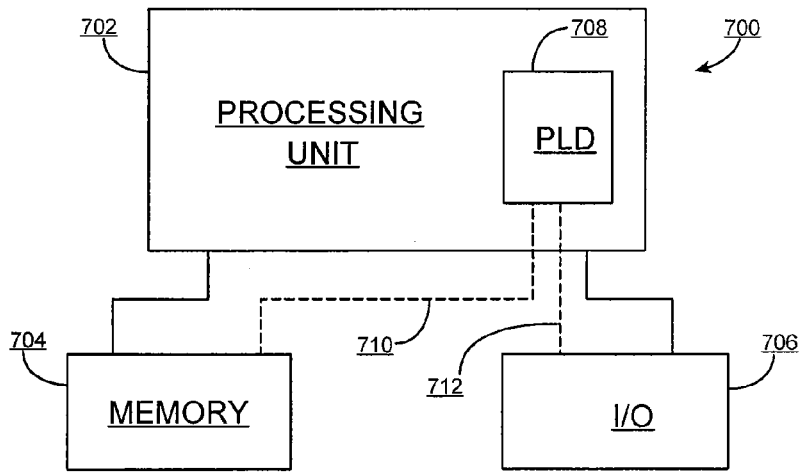
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a PLD 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

The present invention thus provides various techniques for dynamic offset cancellation that is enabled by programmable logic. While the above provides a detailed description of various embodiments of the invention, many alternatives, modifications, and equivalents are possible. Therefore the scope of this invention should not be limited by the specific embodiments described above, and should instead be determined with reference to the appended claims along with their full scope of equivalents.

What is claimed is:

1. An integrated circuit comprising:
    a buffer circuit;
    an offset cancellation circuit for canceling an offset voltage of the buffer circuit;
    programmable circuitry operable to generate one or more offset control signals that are received by the offset cancellation circuit; and
    a signal receiving circuit connected to the offset cancellation circuit and to the programmable circuitry, wherein the signal receiving circuit is configured to amplify signals received from the offset cancellation circuit and provide data bits to the programmable circuitry,
    wherein the programmable circuitry is configured to:
        monitor the error rate of data bits received by the buffer circuit and resolved by the signal receiving circuit; and
        alter the offset control signals in response to the error rate.

2. The integrated circuit of claim 1, wherein the signal receiving circuit comprises a high-speed serial interface, digital power amplifier, serializer/deserializer, phase lock loop, digital locked loop, clock networks and combinations thereof.

3. The integrated circuit of claim 1, wherein the programmable circuitry comprises a data analysis circuit, wherein the data analysis circuit is configured to deterimine the efect of the one or more signal offsets on operations of the integrated circuit.

4. The integrated circuit of claim 1, wherein the offset cancellation circuit and the programmable logic form a feedback loop configured to reduce the one or more signal offsets to a predetermined level.

5. A buffer circuit comprising:
    a first differential input transistor and a second differential input transistor;
    a first current source and a second current source coupled respectively to first terminals of the first and second differential input transistors; and
    a de-skewing circuit coupled to the first differential input transistor and the second differential input transistor, wherein the de-skewing circuit comprises a first programmable current source and a second programmable current source coupled respectively to the first terminals and to the first and second current sources,
    wherein the de-skewing circuit comprises a first differential transistor and a second differential transistor coupled to the first and second differential input transistors, and
    wherein the first and second differential transistors and the first and second differential input transistors are coupled in parallel.

6. The buffer circuit of claim 5, wherein the de-skewing circuit is configured to receive an offset control signal.

7. The buffer circuit of claim 5, wherein the first and second differential input transistors are configured to receive and amplify a differential input signal.

8. The buffer circuit of claim 5, wherein the first and second differential input transistors comprise a differential input buffer.

9. The buffer circuit of claim 5, wherein the de-skewing circuit is configured to receive an offset control signal via the first and second differential transistors.

10. The buffer circuit of claim 5, wherein the first and second programmable current sources and the first and second current sources are coupled in parallel.

11. The buffer circuit of claim 5, wherein the de-skewing circuit is configured to receive an offset control signal via the first and second programmable current sources.

12. A differential amplifier comprising an offset current source in parallel with a main current source, wherein the offset current source is responsive to an offset control signal, and wherein the offset current source and the main current source are both coupled with a same terminal of a first and second differential input transistor of the differential amplifier, further comprising a first differential transistor and a differential input transistor, wherein the first and second differential transistors and the first and second differential input transistors are coupled in parallel.

13. The differential amplifier of claim 12, wherein the main current source comprises a first current source and a second current source coupled respectively to the first and second differential input transistors, and wherein the offset current source comprises a first programmable current source and a second programmable current source coupled respectively to the first and second current sources.

14. The differential amplifier of claim 12, wherein the main current source and the offset current source are coupled in parallel.

15. The differential amplifier of claim 12, wherein the offset control signal is generated by programmable logic residing on a same integrated circuit as the differential amplifier.

16. The integrated circuit of claim 1, wherein if the error rate is too high, the programmable circuitry changes the offset control signals, and if the change in offset control signal results in an increase in error rates, the programmable circuitry responds by changing the offset control signals in the opposite direction.

17. A buffer circuit comprising:
a first differential input transistor and a second differential input transistor, each having a first terminal and a second terminal;
a first differential transistor having a first terminal coupled to the second terminal of the first differential input transistor;
a second differential transistor having a first terminal coupled to the second terminal of the second differential input transistor;
a first current source and a second current source coupled respectively to the first terminals of the first and second differential input transistors; and
a first programmable current source and a second programmable current source also coupled respectively to the first terminals of the first and second differential input transistors and to the first and second current sources.

18. The buffer circuit of claim 17, wherein second terminals of the first and second differential transistors are respectively coupled to third and fourth current sources.

* * * * *